(12) United States Patent
Joharapurkar et al.

(10) Patent No.: US 8,624,870 B2
(45) Date of Patent: Jan. 7, 2014

(54) SYSTEM FOR AND METHOD OF TRANSFERRING CHARGE TO CONVERT CAPACITANCE TO VOLTAGE FOR TOUCHSCREEN CONTROLLERS

(75) Inventors: Ashutosh Ravindra Joharapurkar, Karnataka (IN); Karthikeya Kodur, Karnataka (IN); Venugopal Reddy, Karnataka (IN); Patrick Chan, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 305 days.

(21) Appl. No.: 12/986,841

(22) Filed: Jan. 7, 2011

(65) Prior Publication Data
US 2011/0261006 A1 Oct. 27, 2011

Related U.S. Application Data

(60) Provisional application No. 61/326,830, filed on Apr. 22, 2010.

(51) Int. Cl.
*G06F 3/045* (2006.01)

(52) U.S. Cl.
USPC ...... 345/174; 345/173; 178/18.01; 178/18.06

(58) Field of Classification Search
USPC .................. 345/173, 174; 178/18.01, 18.06
See application file for complete search history.

(56) References Cited

U.S. PATENT DOCUMENTS

| | | | |
|---|---|---|---|
| 4,527,096 A | 7/1985 | Kindlmann | |
| 5,313,141 A | 5/1994 | Kimball | |
| 5,463,283 A | 10/1995 | Sanderson | |
| 5,789,870 A | 8/1998 | Remson | |
| 6,466,036 B1 | 10/2002 | Philipp | |
| 6,937,124 B1 | 8/2005 | Nakamura et al. | |
| 7,061,327 B2 | 6/2006 | Doy | |
| 7,176,753 B2 | 2/2007 | Noda et al. | |
| 7,283,120 B2 | 10/2007 | Grant | |
| 7,667,371 B2 | 2/2010 | Sadler et al. | |

(Continued)

FOREIGN PATENT DOCUMENTS

WO 9743825 11/1997

OTHER PUBLICATIONS

Publication No. US-2011-0261005-A1, Publication Date: Oct. 27, 2011, U.S. Appl. No. 12/986,776, filed Jan. 7, 2011, Ashutosh Ravindra Joharapurkar.

(Continued)

*Primary Examiner* — Koosha Sharifi-Tafreshi
(74) *Attorney, Agent, or Firm* — Advent, LLP

(57) ABSTRACT

A touchscreen controller system determines the actual locations of multiple simultaneous touches by eliminating mutual capacitance between adjacent rows and columns during self-capacitance measurements and selectively enabling mutual capacitance during mutual capacitance measurements. During the self-capacitance measurements, the controller system generates a set of candidate touch locations, which includes the locations of real and ghost touches. During the mutual capacitance measurements, only the locations in the candidate set are measured and, from these measurements, the actual touch locations are determined. By limiting the mutual capacitive measurements to only a small subset of the locations over the entire touch panel, real touch locations are determined on a linear order. Also, by using on-chip integration capacitors, embodiments of the invention are able to perform each measurement in a single cycle.

12 Claims, 13 Drawing Sheets

(56) References Cited

U.S. PATENT DOCUMENTS

| | | | |
|---|---|---|---|
| 2003/0067449 | A1 | 4/2003 | Yoshikawa et al. |
| 2003/0174121 | A1 | 9/2003 | Poupyrev et al. |
| 2006/0119586 | A1 | 6/2006 | Grant et al. |
| 2008/0055277 | A1 | 3/2008 | Takenaka et al. |
| 2008/0062145 | A1 | 3/2008 | Shahoian et al. |
| 2010/0156823 | A1 | 6/2010 | Paleczny et al. |
| 2010/0245286 | A1* | 9/2010 | Parker .......................... 345/174 |
| 2011/0025629 | A1* | 2/2011 | Grivna et al. ................. 345/173 |
| 2011/0061949 | A1* | 3/2011 | Krah et al. ................. 178/18.06 |
| 2011/0084936 | A1* | 4/2011 | Chang et al. ................. 345/174 |
| 2011/0156839 | A1* | 6/2011 | Martin et al. ................. 333/172 |

OTHER PUBLICATIONS

Publication No. US-2011-0261006-A1, Publication Date: Oct. 27, 2011, U.S. Appl. No. 12/986,841, filed Jan. 7, 2011, Ashutosh Ravindra Joharapurkar.

Publication No. US-2011-0261007-A1, Publication Date: Oct. 27, 2011, U.S. Appl. No. 12/986,881, filed Jan. 7, 2011, Ashutosh Ravindra Joharapurkar.

Publication No. US-2011-0260990-A1, Publication Date: Oct. 27, 2011, U.S. Appl. No. 12/986,991, filed Jan. 7, 2011, Yassir Ali.

Publication No. US-2011-0261008-A1, Publication Date: Oct. 27, 2011, U.S. Appl. No. 12/987,008, filed Jan. 7, 2011, Ashutosh Ravindra Joharapurkar.

Non-Final Office Action dated Sep. 29, 2011, U.S. Appl. No. 12/315,690, filed Dec. 5, 2008, Anthony Stephen Doy.

International Search Report dated Dec. 3, 2009, PCT Patent Application Serial No. PCT/US 09/61359, Filed Oct. 20, 2009, Maxim Integrated Products, Inc.

Daniel Carrica et al., "Random Sampling Applied to the Measurement of a DC Signal Immersed in Noise", pp. 1319-1323, IEEE Transactions on Instrumentation and Measurement, vol. 50, No. 5, Oct. 2001.

\* cited by examiner

SYSTEM FOR AND METHOD OF TRANSFERRING CHARGE TO CONVERT CAPACITANCE TO VOLTAGE FOR TOUCHSCREEN CONTROLLERS

RELATED APPLICATIONS

This application claims priority under 35 U.S.C. §119(e) of the co-pending U.S. provisional patent application Ser. No. 61/326,830, filed Apr. 22, 2010, and titled "Differential Capacitive Touchpad Circuit and Method," which is hereby incorporated by reference in its entirety.

The following co-owned, co-filed, and co-pending applications, U.S. patent application Ser. No. 12/986,776, titled "Method and Apparatus for Improving Dynamic Range of a Touchscreen Controller," U.S. patent application Ser. No. 12/986,881, titled "Noise Cancellation Technique for Capacitive Touchscreen Controller Using Differential Sensing," U.S. patent application Ser. No. 12/986,991, titled "System Integration of Tactile Feedback and Touchscreen Controller for Near-Zero Latency Haptics Playout," U.S. patent application Ser. No. 12/987,008, titled "Use of Random Sampling Technique to Reduce Finger-Coupled Noise," and U.S. patent application Ser. No. 12/986,905, titled "Method and Apparatus for Generating Piezoelectric Transducer Excitation Waveforms Using a Boost Converter," are all also incorporated by reference in their entireties.

FIELD OF THE INVENTION

This invention relates to human-to-machine interfaces. More specifically, this invention relates to capacitive touchscreens.

BACKGROUND OF THE INVENTION

Touchscreens or touch panels provide an interface for displaying output and receiving input, a structure that makes them well suited for mobile phones, personal digital assistants, digital music players, and other compact devices. Using a touchscreen, a user can select or manipulate items displayed on the touchscreen, such as buttons, sliders, scroll wheels, and other screen icons.

Prior art systems use different methods to detect the presence of an object, such as capacitive charge transfer methods and relaxation OSC methods. In a capacitive touchscreen, for example, charge is transferred to sensing elements and objects adjacent to them. The combined stored charge is then read, with charges above a threshold indicating that the object is above the sensing element currently being read. By arranging sensing elements into a grid pattern having rows and columns, the particular location of an object on the grid can be determined.

FIG. 1 is a block diagram of prior art capacitive touchscreen 100. The touchscreen 100 comprises a surface containing multiple sensing elements 101, each configured to sense the presence an object, such as a finger 105, adjacent to it. By detecting which ones of the sensing elements the object 105 is adjacent to, the location of the object along the surface of the touchscreen 100 is determined. The capacitive touchscreen 100 functions by opening and closing switches A, A' B, B', C, and C' to transfer charge that is measured by measuring circuits 110 and 115 and calculated by calculation means 120. Those skilled in the art will recognize that the capacitive touchscreen 100 requires multiple clock phases and multiple charge transfer cycles to determine whether an object is adjacent to its surface.

The touchscreen 100 has several disadvantages. For example, charge must be transferred to external capacitors $C_{S1}$ and $C_{S2}$ several times to measure capacitance change. This increases the latency and thus reduces the maximum frame rate that can be supported. As a result, the touchscreen 100 has limited sensitivity and a reduced signal-to-noise ratio.

The touchscreen 100, like other prior art capacitive touchscreens, also suffers from "ghosting," during which the actual locations of simultaneous touches cannot be resolved. When simultaneous touches occur at multiple locations, the system is only able to determine that several touches occurred, the "real" touches and "ghost" touches. The system is unable to easily distinguish between the real and ghost touches. This ambiguity, and the processing needed to resolve it, increases exponentially with the number of simultaneous touches.

Some capacitive touchscreens determine simultaneous touches using "mutual capacitance," a process that senses capacitances at the intersections of row and column lines. Systems that support mutual capacitance measurements require much more complex analog hardware, which results in higher power dissipation, lower throughput rate, larger die size, and more complex signal processing.

SUMMARY OF THE INVENTION

Touchscreen controller systems in accordance with the invention support mutual capacitance cancellation and selective mutual capacitance measurements between sensors, reducing the requirement of offset canceling capacitances. These touchscreen controller systems are also capable of eliminating ghost touches on a panel, a feature that is critical in detecting multi-touches without ambiguity. It does this without needing to take mutual capacitance measurements between each combination of row and column.

Touchscreen controller systems in accordance with the invention need only a single charge transfer cycle to detect capacitance changes that indicate the presence of an object. These touchscreen controller systems use on-chip integration capacitors, which are much smaller than external integration capacitors and can be charged and discharged more quickly. These touchscreen controller systems can support faster frame rates, can improve sensitivity, and require no external components for the sensors.

Touchscreen controller systems in accordance with the invention convert sensor capacitance of a touch screen panel to a directly proportional voltage. In a reset phase the systems are driven to ground and will not pick up noise from external sources. In one embodiment, except for one switch in the feedback path, all node voltages carry either a reference voltage or ground. This structure reduces the effect of charge injection because most of the charge injection results in a constant offset for the system, an offset that can be accommodated by calibration.

In one aspect of the invention, a touchscreen controller systems for sensing one or more objects adjacent to and/or in contact with a surface of the touchscreen controller includes a plurality of sense lines arranged adjacent to the surface of the touch panel. Adjacent sense lines have a mutual capacitance. A plurality of capacitive sensing elements are each coupled to one of the sense lines. A control logic is configured to drive mutual capacitances between selected and unselected sense lines to the same potential during a self-capacitance measuring stage and to drive mutual capacitances between selected and unselected sense lines to different potentials during a mutual capacitance measuring stage. In one embodiment, the touchscreen controller systems includes a voltage measurement circuit that converts a charge on a selected capacitive sensing element into a corresponding voltage that indicates whether an object is adjacent thereto.

In a second aspect of the invention, a method of sensing presence of objects simultaneously on or adjacent to a surface of a touch panel includes individually selecting row and column lines of the touch panel to determine one or more candidate locations of the objects along the surface and reading combinations of row and column lines of the touch panel from only the candidate locations to determine one or more actual locations of the objects along the surface. In one embodiment, the steps of individually selecting row and column lines and reading combinations of row and column lines are performed on a single integrated circuit. The method also includes canceling mutual capacitance between the row and column lines when individually reading selected row and column lines and selectively enabling mutual capacitance between adjacent row and column lines when reading selected combinations of row and column lines.

In one embodiment, determining one or more actual locations comprises comparing self capacitance measurements of the candidate locations with corresponding mutual capacitance measurements.

DETAILED DESCRIPTION OF THE INVENTION

The present invention encompasses techniques for reducing or eliminating error in the output of capacitive sensor arrays such as touchpads, touchscreens, touch sliders and the like, including sensors that detect the presence and position of a stylus, as well as those that detect and determine finger position. While the illustrative embodiment described herein is applied in a mobile telephone, it is understood that capacitive touch sensors are used in a wide variety of devices. Examples of such devices are portable devices, such as personal digital assistants (PDA5), global positioning systems (GPS) receivers, as well as larger devices such as touchscreen enabled displays and computer systems, as well as appliances.

Figure 1:
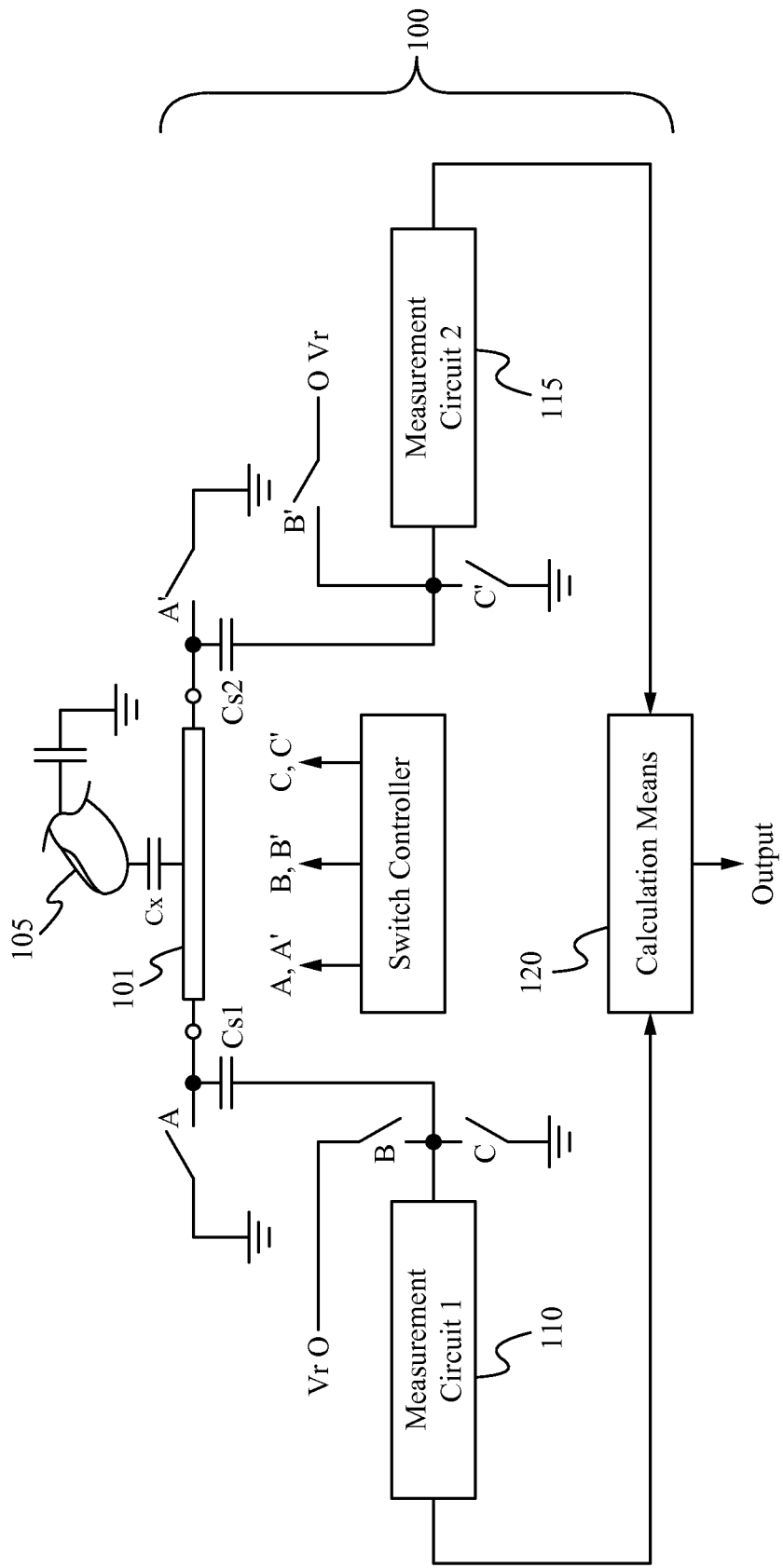
FIG. 1 is a schematic diagram of a prior art touchscreen.
Figure 2:
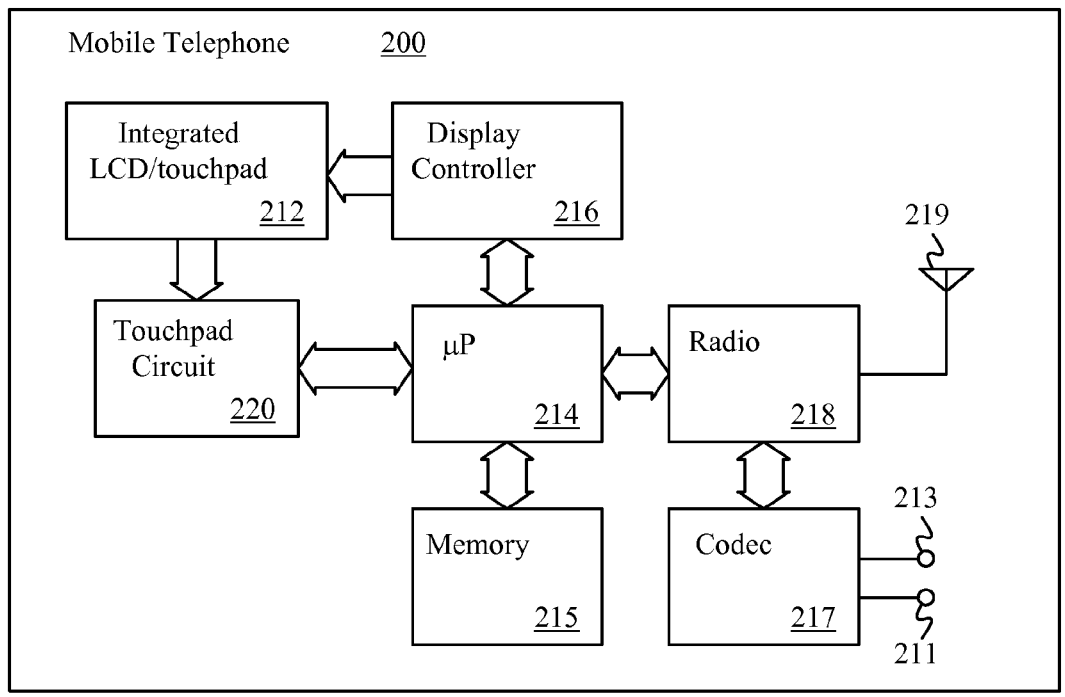
FIG. 2 is a block diagram of a mobile telephone having a touchscreen, used to explain principles of the invention.

Referring now to FIG. 2, a mobile telephone 200 in accordance with one embodiment of the present invention is shown. The mobile telephone 200 includes a microprocessor (μP) 214 coupled to a memory 215 that stores program instructions for execution by the microprocessor 214, and generally includes non-volatile storage for such program instructions, as well as temporary storage for use by the microprocessor 214. The program instructions stored in a memory 215 include program instructions forming computer program products in accordance with embodiments of the present invention that determine the position of one or more fingers and/or styli at the surface of a touch sensor included in an integrated liquid crystal display (LCD)/touchpad 212. The LCD/touchpad 212 is coupled to a touchpad circuit 220 in accordance with one embodiment of the present invention that includes the capability of simultaneously measuring the capacitance of two or more elements of the touchpad within the LCD/touchpad 212. Alternatively, as will be described in further detail below, the present invention may integrate a voltage present on the two or more elements which is generally produced by providing a reference potential to another layer. Integrator circuit(s) may be provided to perform the integration, or the present invention may include program instructions within the memory 215 that measure the voltages present on the two or more elements, from simultaneous samples of the voltages, and integrate the voltages. The mobile telephone 200 also includes a display controller 216 for coupling the microprocessor 214 to the LCD within the integrated LCD/touchpad 212 and radio circuits 218 for providing wireless telephone communication connections. The mobile telephone 200 also includes an audio codec 217 coupled to a microphone 213 and a speaker element 211 that provide voice communications with a user.

In accordance with the present invention, the capacitance of two or more rows/columns of a two-dimensional touchpad array or two or more elements of a one-dimensional touchpad array, such as a slider, are measured simultaneously, either directly, or by measuring a voltage present on the elements. The measurements are subtracted to yield a measurement free of common-mode error that is primarily due to incident noise, such as that produced by operation of the LCD, any backlight or other power supply under integrated LCD/touchpad 212 and other external environmental sources of noise.

Figure 3:
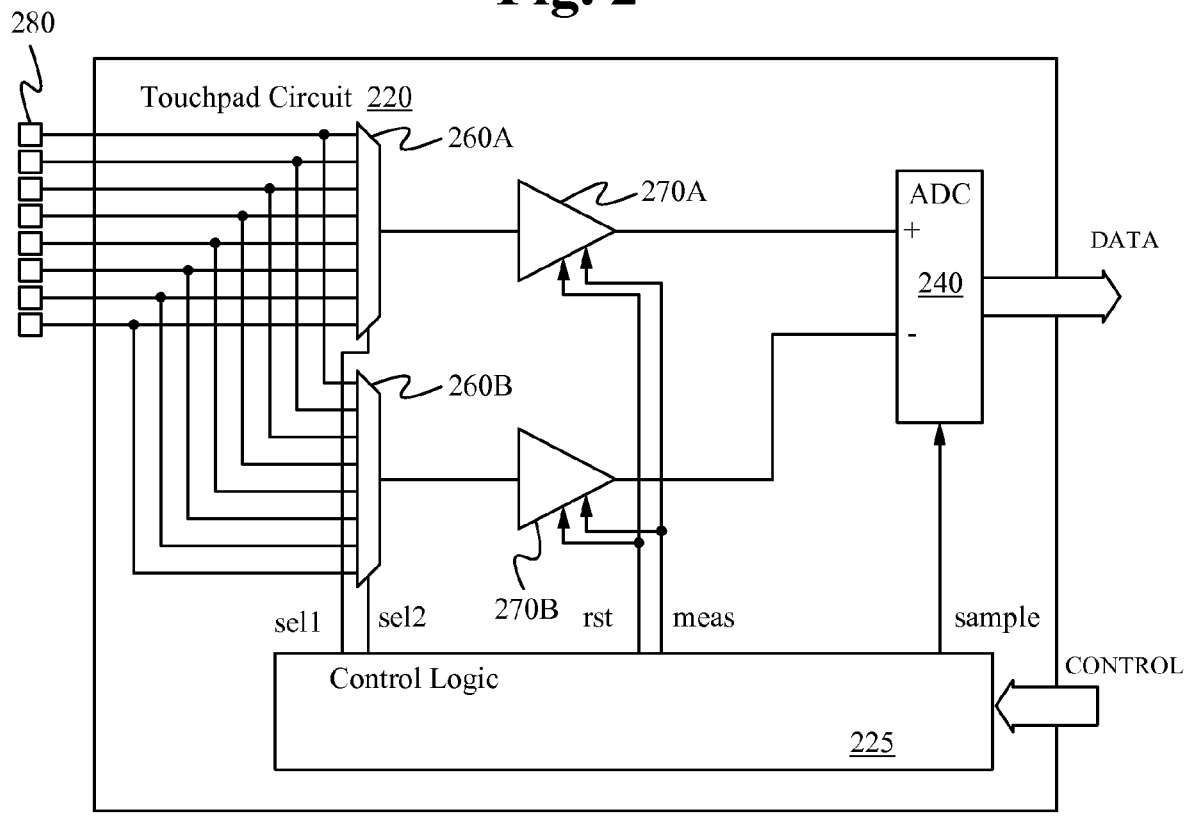
FIG. 3 is a schematic diagram showing several components of a touchscreen, used to explain principles of the invention.

Referring now to FIG. 3, details of the touchpad circuit 220 in the mobile telephone 200 of FIG. 2 are shown in accordance with one embodiment of the present invention. As in all the figures, the same label refers to the same or similar element. The touchpad circuit 220 includes a pair of multiplexers 260A and 260B coupled to each of eight rows of touchpad elements 280. Single touchpad elements 280 are illustrated, but it is understood that more or fewer rows and columns of equal or unequal numbers and both one and two-dimensional touchpads can utilize the techniques of the present invention. The multiplexer 260A selects a first row/element from among the touchpad elements 280. The multiplexer 260B selects another second row/element from among the touchpad elements 280. A pair of capacitance measuring circuits 270A and 270B each measures the capacitance at the output of the multiplexers 260A and 260B, respectively, which will change due to the presence of a finger/stylus near the selected element, and converts the capacitances to corresponding voltage signals.

A control logic circuit 225 provides a reset signal Rst for resetting capacitance measuring circuits 270A and 270B, which prepares capacitance measuring circuits 270A and 270B to make capacitance measurements. The control logic can be integrally formed with the microprocessor 214. In such a case the signal Rst will be provided by the microprocessor 214. Selection values Sel1 and Sel2 are set at address inputs of multiplexers 260A and 260B for selecting the measurement elements prior to performing the measurement. The reset signal Rst is de-asserted, thereby permitting the capacitance measuring circuits 270A and 270B to measure the capacitance of the respective selected touchpad elements 280. The outputs of the capacitance measuring circuits 270A and 270B are applied differentially to the inputs of an analog-to-digital converter (ADC) 240, which provides digital values corresponding to the difference between the capacitances measured at the outputs of the multiplexers 270A and 270B, after a sample control signal, Sample, signal is asserted for sampling the outputs of the capacitance measuring circuits 270A and 270B. Therefore any common-mode noise and offset present at the outputs of multiplexers 260A and 260B will be substantially canceled in the output of ADC 240.

Figure 4:
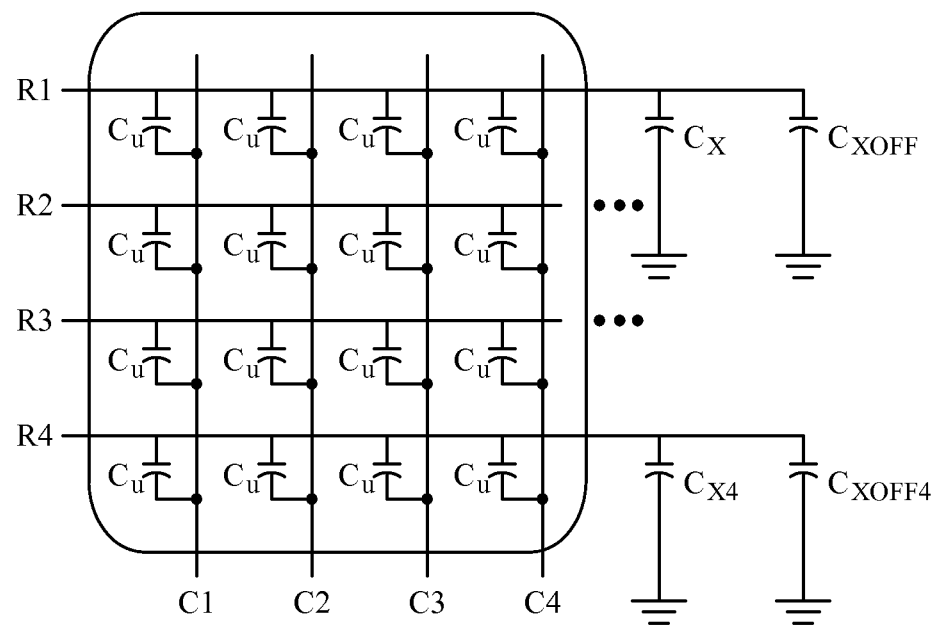
FIG. 4 is a high-level diagram modeling component and parasitic capacitive elements of a capacitive touchscreen, used to explain principles of the invention.

FIG. 4 is a schematic diagram 400 modeling the touch pad circuit 220 of FIG. 3, used to explain principles of the invention. The schematic 400 shows that each intersecting row and column lines (e.g., R1 and C1) that form the touchpad 212 contains a mutual capacitance $C_U$. Each row line contains a sensor capacitance ($C_X$) and a sensor offset capacitance ($C_{XOFF}$), both coupled to ground. For modeling purposes, it will be appreciated that $C_{XOFF}$ can be combined into its corresponding $C_X$.

Figure 5A:
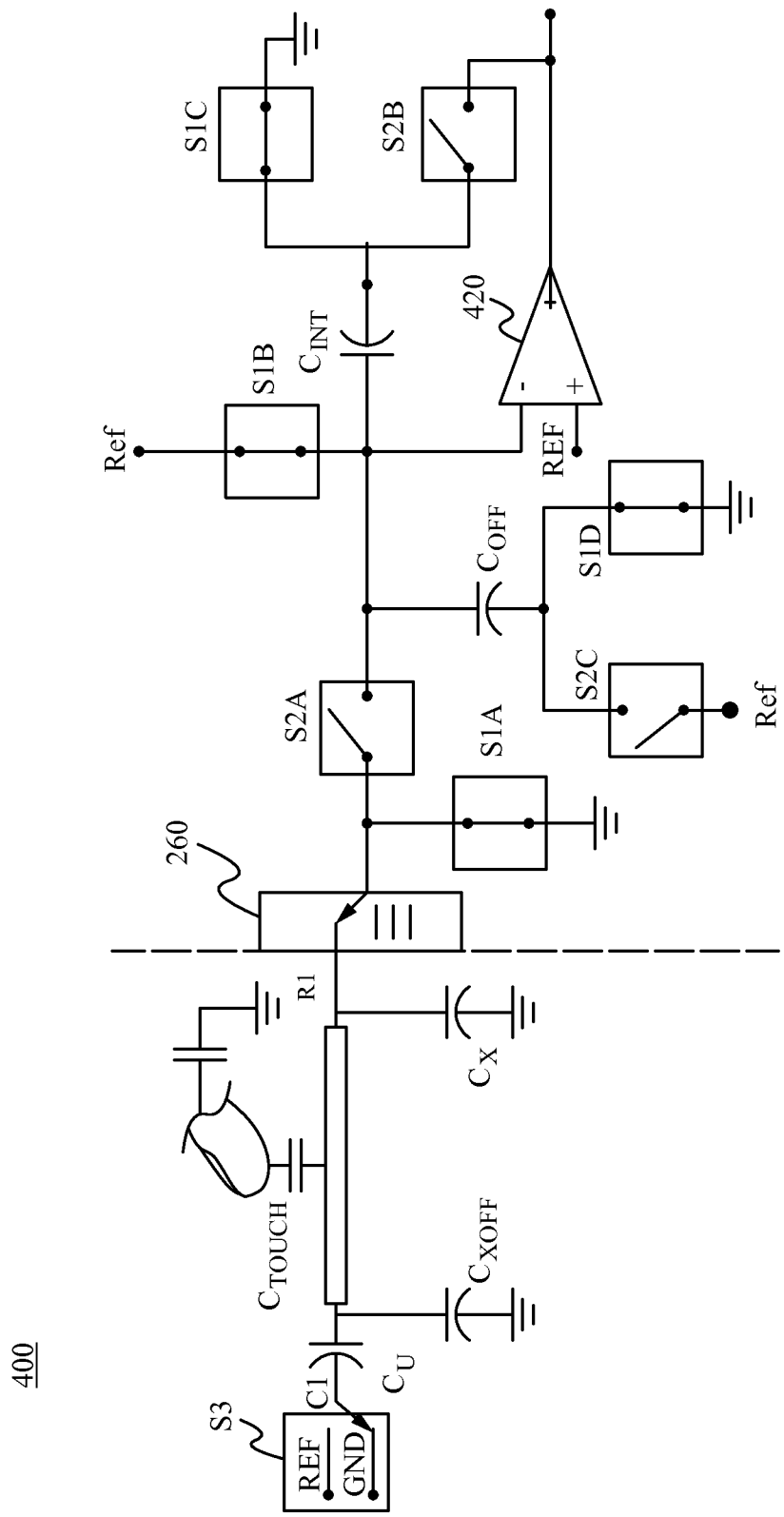
FIGS. 5A and 5B show a sensor component during reset and measurement phases, respectively, in accordance with one embodiment of the invention.

Referring now to FIG. 5A, details of capacitance measuring circuits 270A and 270B (collectively, 270) of FIG. 3 are shown. A capacitance measuring circuit, as provided in one embodiment of the present invention, includes a switching network formed by the switches S1A-S1D, the switches S2A-S2C, and the switch S3. A feedback or integration capacitor $C_{INT}$ is selectively coupled to an operational amplifier 420 by the switches S1C and S2B. As shown in FIG. 5A, when the reset signal Rst is asserted, the switch S3 couples the input of mutual capacitor $C_U$ to ground and the switch S1B couples the inverting input of the amplifier 420 to a reference voltage $V_{REF}$. Also during assertion of the reset signal Rst, the switch S2B is open and the switch S1C is closed, causing the integration capacitor $C_{INT}$ to be charged to the reference voltage $V_{REF}$. Also during the assertion of the reset signal Rst, the switch S1A is closed, coupling the output of the multiplexer 260 to ground, which discharges a capacitance $C_X$ of the selected element, and any stray offset capacitance along the path to the selected element $C_{XOFF}$. An offset cancellation capacitor $C_{OFF}$ is coupled to the inverting input of the operational amplifier 420 and charged to the reference voltage $V_{REF}$ when the reset signal Rst is asserted by the activation of the switch S1D that grounds the second terminal of the offset cancellation capacitor $C_{OFF}$. Therefore, after a settling time, the condition of the capacitances in the capacitance measurement circuit 270 are such that the integration capacitor $C_{INT}$ and the offset cancellation capacitor $C_{OFF}$ are charged to the reference voltage $V_{REF}$, and the element capacitance $C_X$ and any stray offset capacitance $C_{XOFF}$ are substantially discharged.

Figure 5B:
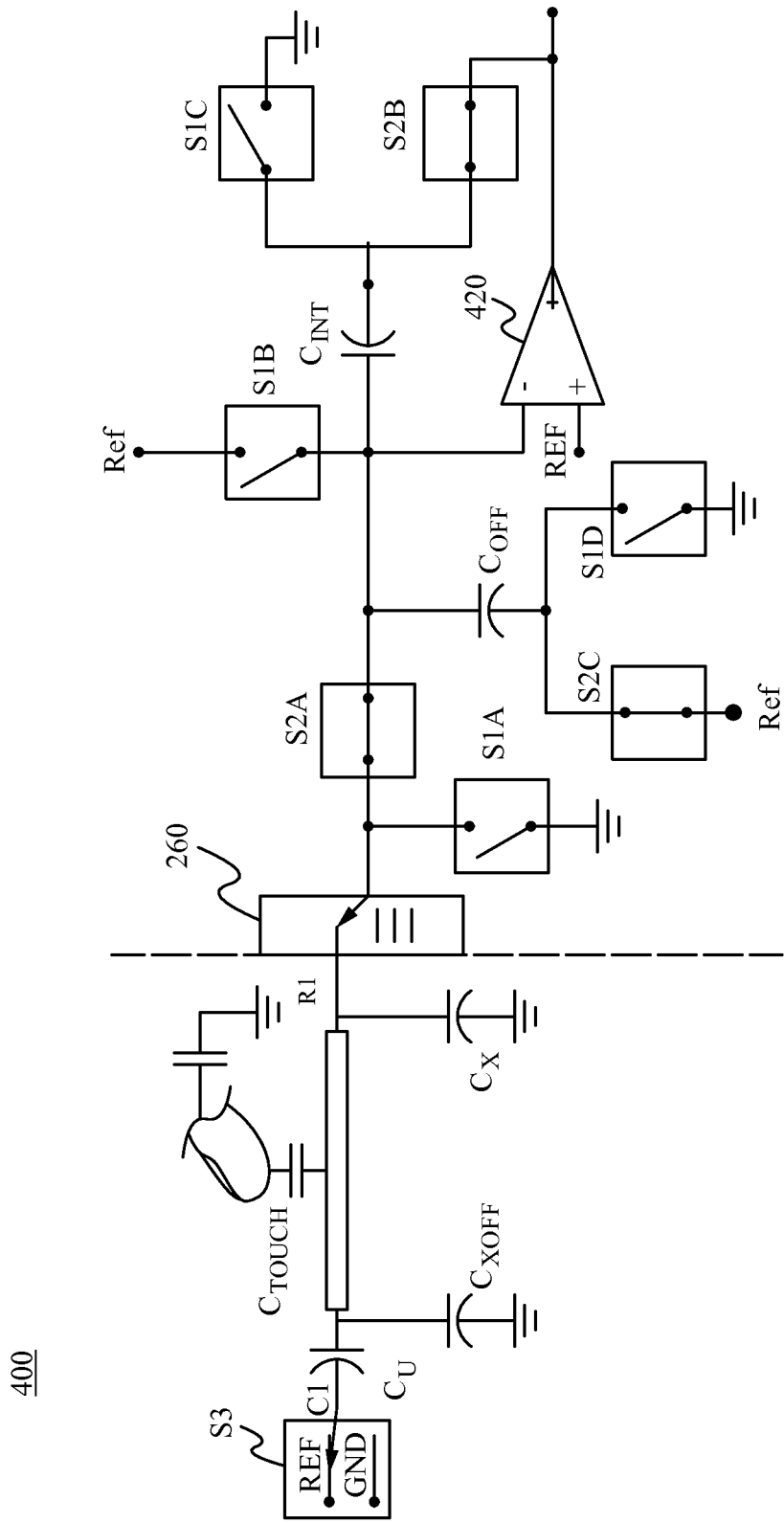

As shown in FIG. 5B, when a measurement control signal Meas is asserted after the reset signal Rst is de-asserted, which is generally performed by ensuring non-overlapping control signals generated by the control logic 225, the switches S1C and S1B are open due to the de-assertion of the reset signal Rst, and the switch S3 couples the mutual capacitance $C_U$ to the reference voltage $V_{REF}$. The switch S2B is closed by assertion of the measurement control signal Meas, causing the integration capacitor $C_{INT}$ to be coupled between the output and the inverting input of the operational amplifier 420. Since the integration capacitor $C_{INT}$ is charged to a voltage of $V_{REF}$ with respect to the input terminal, and since the non-inverting input of the operational amplifier 420 is also referenced to the reference voltage $V_{REF}$, the initial output of the operational amplifier 420 will be substantially zero. During assertion of the measurement control signal Meas, the switch S2A is closed, and the switch S1A was previously opened at de-assertion of the reset signal Rst. Also, the offset cancellation capacitor $C_{OFF}$ is de-coupled from ground when the reset signal Rst causes the switch S1D to open, and is coupled to the reference voltage $V_{REF}$ at the previously-grounded terminal when the measurement control signal Meas causes the switch S2C to close. As a result of the closure of the switches S2A and S2C, a positive charge amount equal to $C_{OFF}*V_{REF}$, where $C_{OFF}$ is the capacitance of the offset cancellation capacitor $C_{OFF}$, is transferred from the offset cancellation capacitor $C_{OFF}$ to the integration capacitor $C_{INT}$ and a negative charge amount equal to $-C_X*V_{REF}$ is transferred from the output terminal of the multiplexer 260 to the integration capacitor $C_{INT}$, where $C_X$ is the sum of the capacitances of the element capacitance $C_X$ and any stray offset capacitance $C_{XOFF}$. (Based on a particular context, those skilled in the art will recognize when a label, such as $C_{OFF}$, refers to an element, a value of an element, a charge on an element, etc.)

The output voltage $V_0$ of the operational amplifier 420 is equal to the output-referred voltage across the integration capacitor $C_{INT}$ plus $V_{REF}$, which can be computed from $V_0 = Q_F/C_{INT} + V_{REF}$ where $Q_F$ is the charge on the integration capacitor $C_{INT}$. The total charge transferred to the integration capacitor $C_{INT}$ when the measurement control signal Meas is asserted is $C_X*V_{REF} - C_{OFF}*V_{REF} = \Delta Q_F$. The initial charge on the integration capacitor $C_{INT}$ is $-C_{INT}*V_{REF}$, so the final value of charge $Q_F$ is given by Equation (1):

$$-C_{INT}*V_{REF} + C_X*V_{REF} - C_{OFF}*V_{REF} \qquad \text{Equation (1)}$$

and the output voltage $V_0$ is given by Equation (2):

$$V_0 = (-C_{INT}*V_{REF} + C_X*V_{REF} - C_{OFF}*V_{REF})C_{INT} + V_{REF} = (C_X/C_{INT} - C_{OFF}/C_{INT})*V_{REF} \qquad \text{Equation (2)}$$

The same result can be obtained by applying charge conservation at the inverting input terminal of the operational amplifier 420. Therefore, the output voltage $V_0$ is proportional to the capacitance of the element plus any stray offset capacitance. The offset cancellation capacitor $C_{OFF}$ provides biasing of the measurement away from an always negative result, and the relative capacitance of the integration capacitor $C_{INT}$ sets the dynamic range of the measurement. In one embodiment of the present invention, the integration capacitor $C_{INT}$ can have a much higher capacitance relative to the capacitances $C_X$ and $C_{XOFF}$, and the switches S1A and S2A are operated by separate clock signals having a higher frequency than the measurement control signal Meas and the reset signal Rst. The operational amplifier 420 and the integration capacitor $C_{INT}$ will then act as an integrator, integrating the charge transferred from the capacitance at the output of the multiplexer 260, providing additional filtering of noise.

The feedback factor for the operational amplifier 420 is determined by the ratio of $C_X$ and $C_{OFF}$ to $C_{INT}$. $C_X$ is an external capacitor that the designers have no control over. It can change from a very small value to a large value. $C_{OFF}$ is used to cancel the effect of parasitic capacitance, $C_{XOFF}$. In one embodiment, shown in FIG. 6, $C_{OFF}$ is a capacitive digital-to-analog control element made up of unit-sized capacitors. Instead of switching unit capacitors in and out, depending on the value of $C_X$, the number of fingers at the bottom plate of $C_{OFF}$ driven to $V_{REF}$ or ground during the measurement phase can be changed. If the bottom plate of some of the fingers of $C_{OFF}$ is driven to ground in the measurement phase, there is no net charge transfer from these fingers as the voltage across them stays constant in the two cycles. The feedback factor will be set by all the fingers of the $C_{OFF}$ capacitor and the external capacitor $C_X$. This will significantly reduce the variation of the feedback factor of the operational amplifier.

Figure 6:
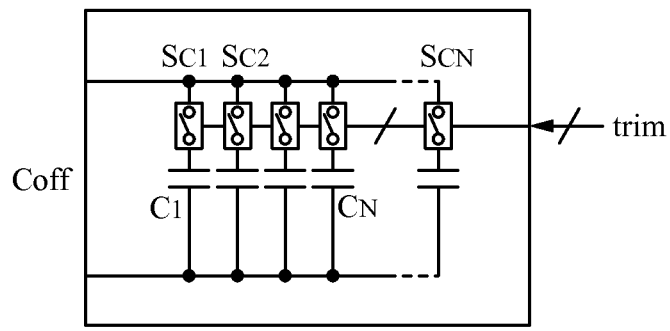
FIG. 6 is a schematic diagram of an offset capacitor in accordance with one embodiment of the invention.

The embodiment of $C_{OFF}$ shown in FIG. 6 allows for the calibration of the capacitance measurement circuit 270 in FIG. 3. In the embodiment of FIG. 6, $C_{OFF}$ can be made programmable. Additional fingers of a capacitor having a common plate are selected by a plurality of switches $S_{C1}$ through $S_{CN}$ in response to a set of digital signals trim, effectively providing for a set of selectable capacitive elements C1-CN that can be used to adjust $C_{OFF}$ on a static per-element basis after calibration. In one embodiment, $C_{OFF}$ is zeroed for offset cancellation.

Referring to FIG. 5A, in one embodiment, the integration capacitor $C_{INT}$ and the operational amplifier 420 are formed on a single integrated circuit. As one example, all the elements to the right of the dotted line are on a single integrated circuit. It will be appreciated that because the integration capacitor $C_{INT}$ is on-chip, it is smaller than similarly functioning capacitors in the prior art, reducing the time needed to charge and discharge it. Such structure decreases the latency of the touchscreen processing.

Figure 7:
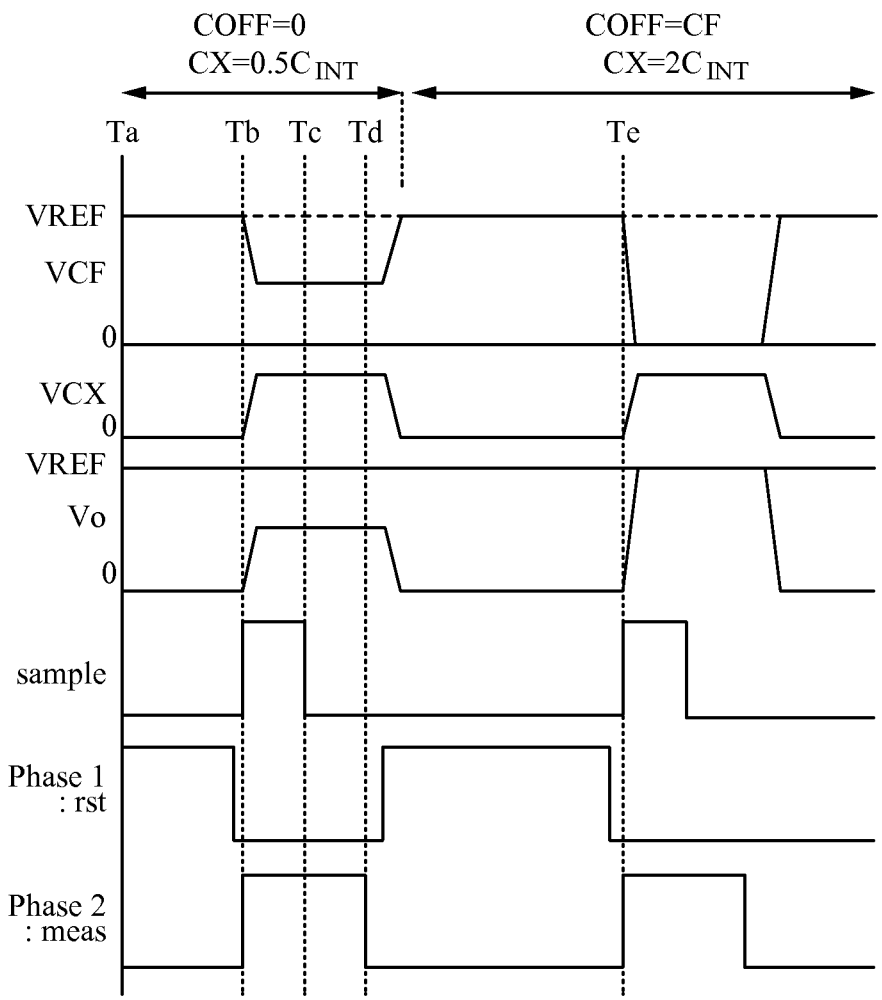
FIG. 7 shows voltage diagrams during reset and measurement phases for the sensor components of FIGS. 5A and 5B.

Referring now to FIG. 7, a signal waveform diagram depicting the operation of the capacitance measurement circuit 400 of FIG. 5A is illustrated. The voltage $V_{CF}$, is the voltage across the feedback capacitor $C_{INT}$ and the voltage $V_{CX}$ is the voltage at the output of the multiplexer 260. During the first assertion of the reset signal Rst, at a time $T_a$, the voltage $V_{CF}$ is set to $V_{REF}$ and the voltage $V_{CX}$ is set to zero. The depicted condition for the first measurement is $C_X=0.50C_{INT}$ and $C_{OFF}=0$. At a time $T_b$, the reset signal Rst is de-asserted and the measurement control signal Meas is asserted. The voltage $V_{CF}$ falls to $0.5V_{REF}$, and the voltage $V_o$ rises to $0.5*V_{REF}$, which is consistent with Equation (2), above. Also at the time $T_b$, the sample control signal Sample is asserted and the value of the difference between the outputs of the capacitance measurement circuits 270A and 270B is sampled and then captured at a time $T_c$ on the falling edge of sample control signal Sample. Since the operation of both of the capacitance measurement circuits 270A and 270B is identical except for the capacitance present at their inputs, only one set of waveforms is shown in FIG. 7. On the next measurement interval starting at time $T_d$, $C_X=2C_{INT}$ and $C_{OFF}=C_{INT}$. The voltage $V_{CF}$ falls to 0, and the voltage $V_0$ rises to $V_{REF}$ which is consistent with Equation (2), above.

It will be appreciated that the number of charge transfer cycles can be increased to increase the range or to perform the integration.

Within an array of capacitive sensor elements, mutual capacitance between rows and columns, as well as between adjacent rows and between adjacent columns, can reduce the effective dynamic range of capacitance measurements, since the mutual capacitance will always be present, or require cancellation by techniques such as increasing offset cancellation capacitor $C_{XOFF}$, in capacitance measurement circuit 400 of FIG. 5A. To avoid stray electrostatic noise from charging unselected ones of elements 280 in FIG. 3 (i.e., those elements not selected by selection values Sel1 and Sel2), the unselected elements can be grounded by circuits within the multiplexers 260A and 260B. Typically the unused sensors are grounded. If the unused sensors are grounded, this will add to the capacitance from the sensor ground in the form of mutual capacitance. This will require a larger offset cancellation capacitor. In the first phase, all the sensors are grounded. In the second phase, the measured sensor goes to $V_{REF}$ as it is coupled to the negative terminal of the operational amplifier. If all the unused sensors are driven to $V_{REF}$ during the second phase, they will contribute no charge towards the integrator output. This will reduce the offset capacitance that needs to be canceled without changing the feedback factor.

In accordance with another embodiment, capacitance is measured at the input of a sensor circuit and produces a proportional voltage output. In accordance with this embodiment, a voltage proportional to the input capacitance in the analog domain is integrated for multiple cycles. This will reduce the post-processing required by the micro controller.

Figure 8A:
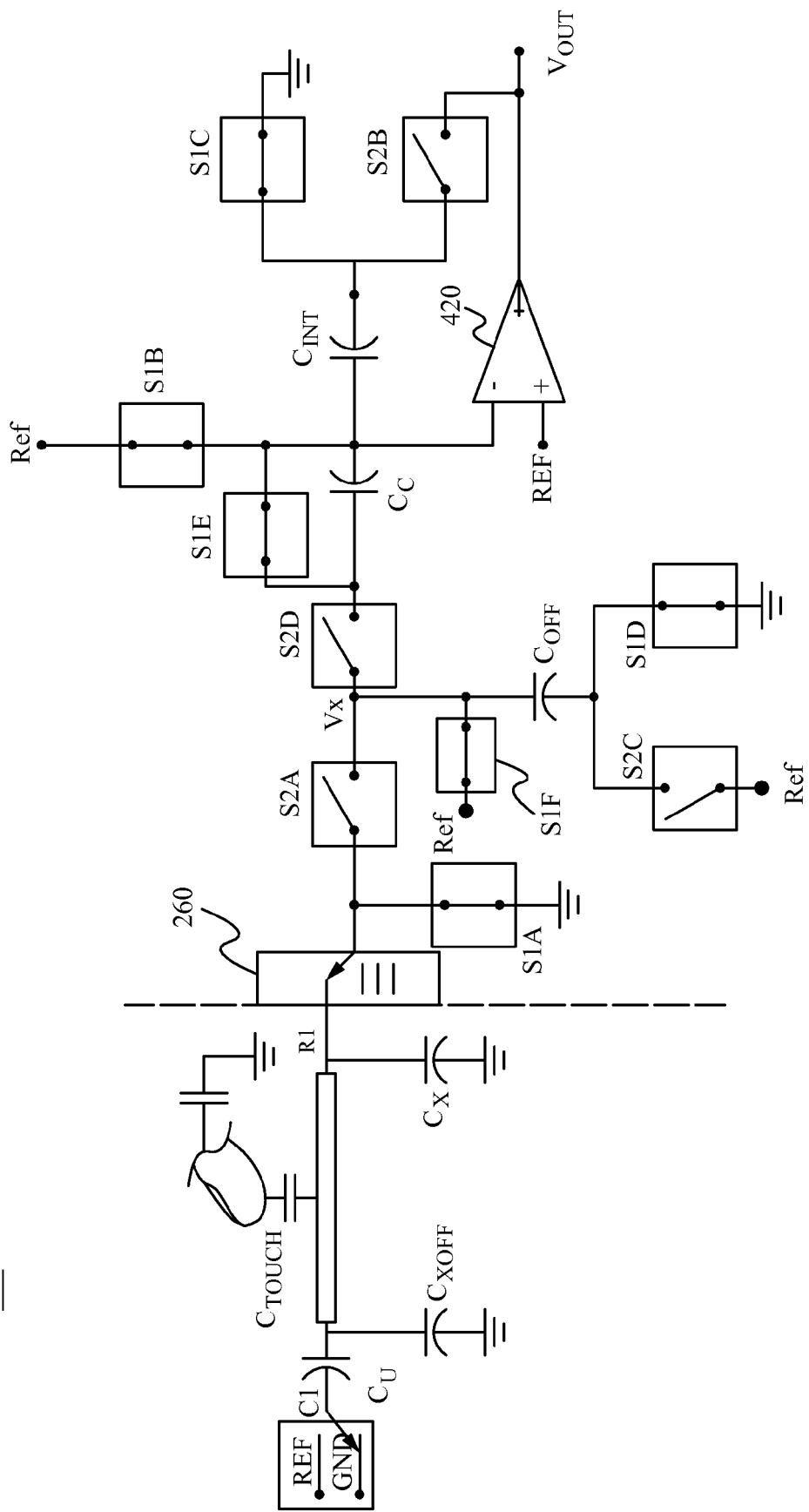
FIGS. 8A-C are schematic diagrams of a sensor component that uses integration operations in accordance with one embodiment of the invention.
Figure 8B:
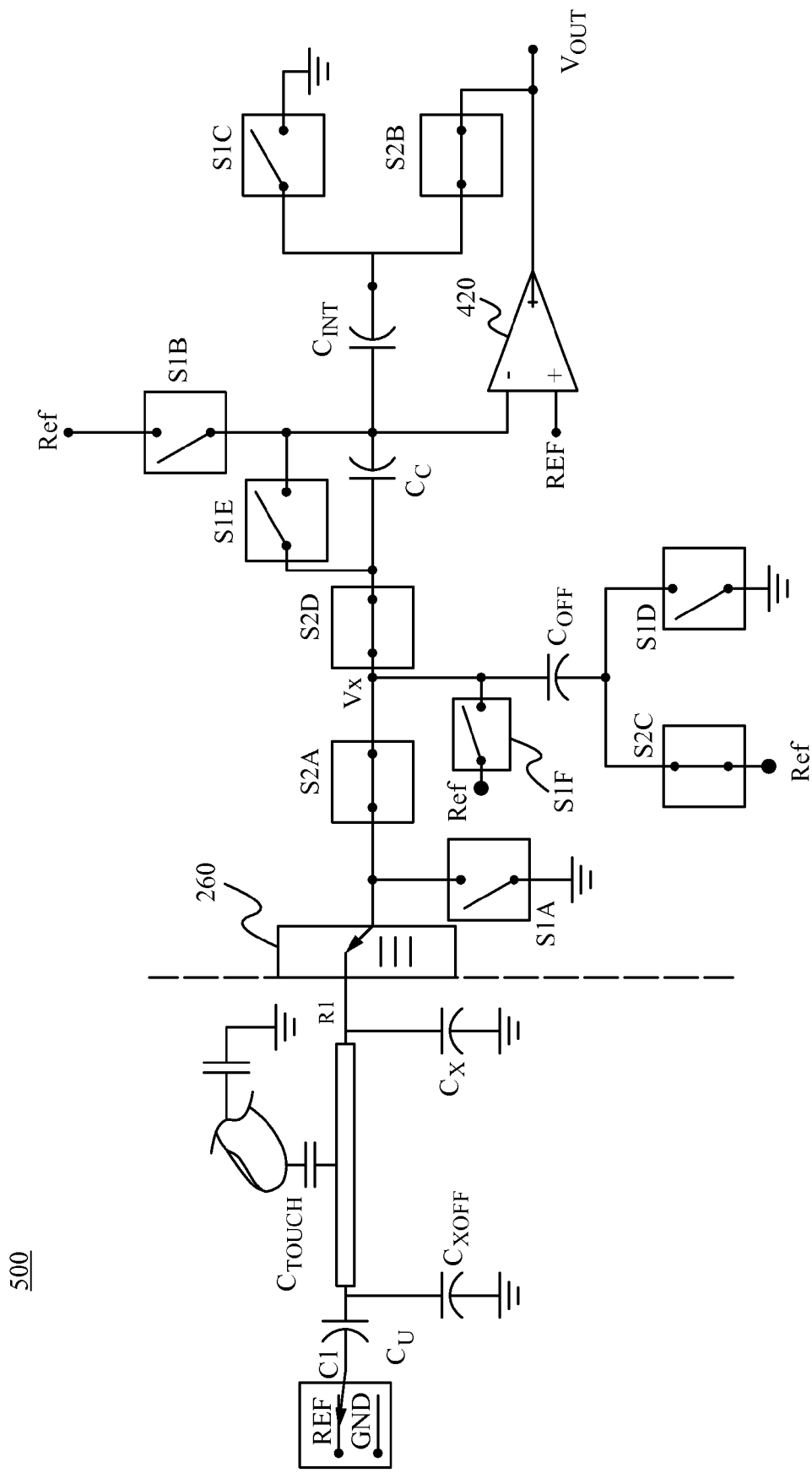
Figure 8C:
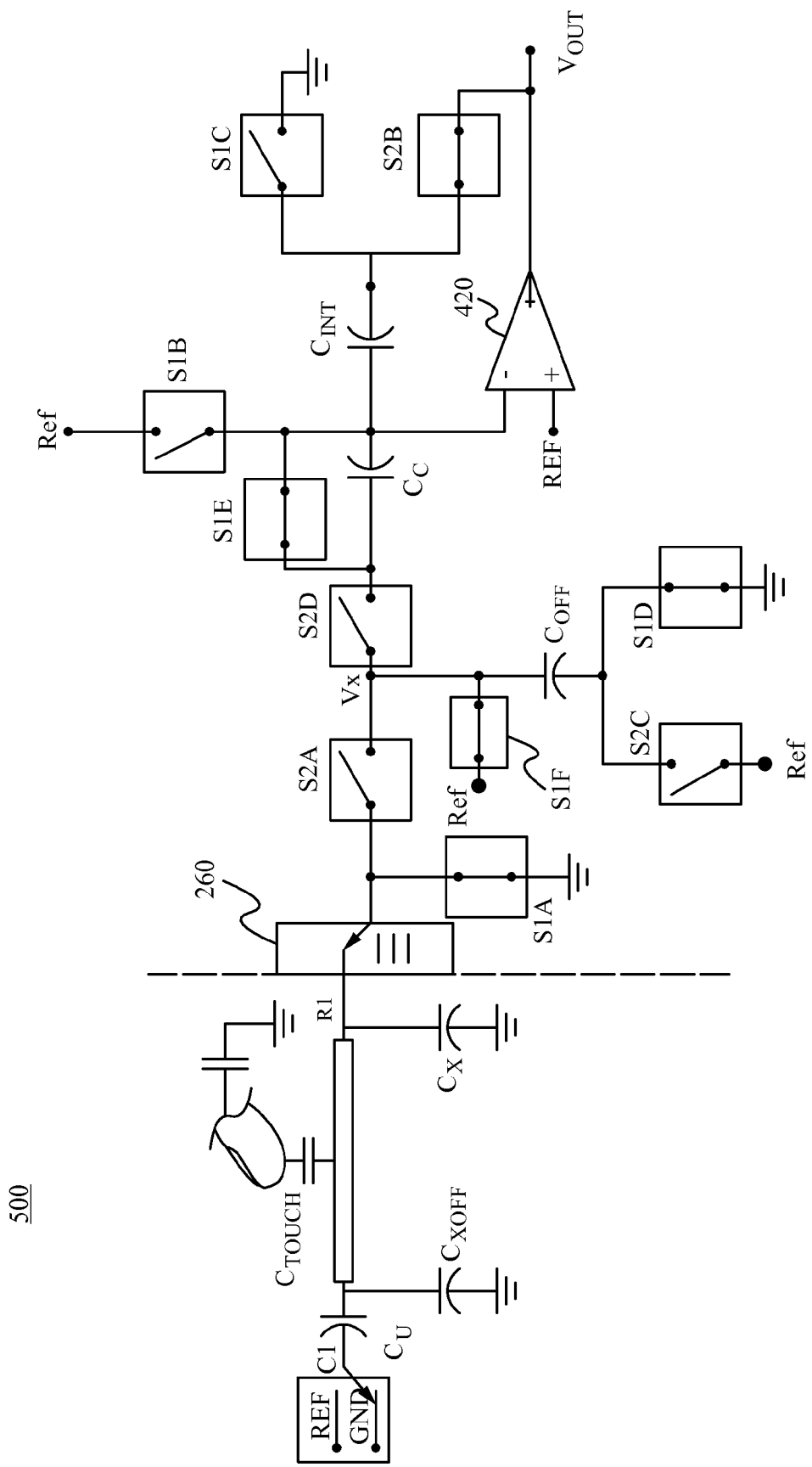

FIGS. 8A-C are schematic diagrams of a sensor circuit 500 using a coupling capacitor Cc for integrating a voltage proportional to an input capacitance in the analog domain, in accordance with one embodiment of the invention. The scheme is similar to the charge transfer circuit shown in FIG. 5A. The circuits in FIGS. 5A and 8A differ in that the circuit 500 has a switch S2D coupling the coupling capacitor Cc to a node $V_X$, a switch S1E across Cc, and a switch S1F coupling a top plate of capacitor $C_{OFF}$ to the reference voltage $V_{REF}$. As in all the figures, similarly labeled elements refer to the identical or a similar element.

The coupling capacitor Cc and the feedback capacitor $C_{INT}$ together form an integrator circuit, which functions as an averager. The charge transferred from $C_C$ onto $C_{INT}$ during each integration cycle. $C_{INT}$ accumulates this charge over the number of integration cycles. The operational amplifier 420 maintains the charge across $C_{INT}$ for all the integration cycles and hence the integrated output. The number of integration cycles that can be performed depends on the maximum sensor capacitance $C_X$ at the input and the ratio of Cc/$C_{INT}$. The increase in the number of integration cycles increases the chances of the sensor circuit 500 getting saturated and thereby losing data. A small value of Cc gives a low integration gain but gives a better settling response. A large value of Cc on other hand gives a better gain, but the settling time requirement also increases.

The choice of N, the number of integration cycles, is a system design consideration and is a tradeoff between digital post-processing time, additional die area, and analog settling time tolerance. If the circuit with lesser settling accuracy can be tolerated against increased die area (due to digital post-processing) then this architecture will be well-suited for such a circuit.

In operation, the feedback capacitor $C_{INT}$ is charged to $V_{REF}$ at the beginning of each channel conversion. For the next N integration cycles, the integration capacitor $C_{INT}$ will remain connected across the operational amplifier 420, between the negative terminal and the output.

The charge transfer occurs over 3 phases, as described below.

FIG. 8A shows the circuit 500 in the integrator reset phase (phase 1), the initial phase for the channel conversion. As shown in FIG. 8A, the switches S1A-F are all closed, and the switches S2A-D are all open. Once the channel to be converted is chosen from the channel multiplexer 260, the input capacitance $C_X$ (the combination of $C_{XOFF}$, $C_{parasitic}$ and $C_{TOUCH}$) is discharged to GND. The offset capacitance $C_{OFF}$ is charged to $V_{REF}$, the integration capacitance $C_{INT}$ is charged to $V_{REF}$, and the coupling capacitor Cc is discharged by shorting its terminals and driving it with $V_{REF}$. The operational amplifier 420 is in a reset phase because both of its terminals are driven to $V_{REF}$ and its output is thus driven to GND.

Next, as shown in FIG. 8B, the sensor circuit 500 is placed in the integrator measure phase (phase 2), the integrate phase for the channel conversion. As shown in FIG. 8B, switches S1A-F are all open, and switches S2A-D are all closed. $C_{OFF}$ is charged to $V_X - V_{REF}$, $C_{INT}$ is charged to $V_{REF} - V_O$, Cc is charged to $(V_X - V_{REF})$, and the inverting terminal of the operational amplifier 420 is driven to $V_{REF}$ by the output of the operational amplifier 420. The operational amplifier 420 is now in an active phase.

Applying charge conservation law at node $V_X$, the following equations are calculated for finding the voltage at $V_X$:

$$C_X*V_X + C_{OFF}*(V_X - 2*V_{REF}) + Cc*(V_X - V_{REF}) = 0 \quad \text{Equation (3)}$$

$$(C_X + C_{OFF} + Cc)*V_X = (2*C_{OFF} + Cc)*V_{REF} \quad \text{Equation (4)}$$

$$V_X = ((2*C_{OFF} + Cc)/(C_X + C_{OFF} + Cc))*V_{REF} \quad \text{Equation (5)}$$

Similarly, applying Kirchoff's Current Law at the summing junction node of the circuit 500, the equation for the output $V_{OUT}$ is obtained:

$$Cc*(V_{REF} - V_X) + C_F*(-V_O) = 0 \quad \text{Equation (6)}$$

$$V_O = (Cc/C_{INT})*(V_{REF} - V_X) \quad \text{Equation (7)}$$

For the Nth integration cycle, the output is given as:

$$V_O = \Sigma_N((Cc/C_{INT})*(V_{REF} - V_X)) \quad \text{Equation (8)}$$

As seen from the Equation (8), the change in the output from one charge transfer cycle to the next is a ratio of ($Cc/C_{INT}$). The node voltage $V_X$ remains constant throughout the number of charge transfer cycles as long as $C_X$ is constant.

Next, as shown in FIG. 8C, the sensor circuit 500 is placed in the coupling capacitance RESET phase (phase 3), which is the discharge phase for the coupling capacitor Cc. As shown in FIG. 8C, the switches S1A, S1D, S1E, S1F, and S2B are all closed, and the switches SIB, S1C, S2A, S2C, and S2D are all open. In the coupling capacitance reset phase, the feedback capacitor $C_{INT}$ remains connected to the output of the operational amplifier 420. The offset cancellation capacitor $C_{OFF}$ is charged to $V_{REF}$. The bottom plates are all tied to GND. The operational amplifier 420 is in the mid cycle reset phase. The output is held constant during this phase because the charge across $C_{INT}$ does not change.

Figure 9:
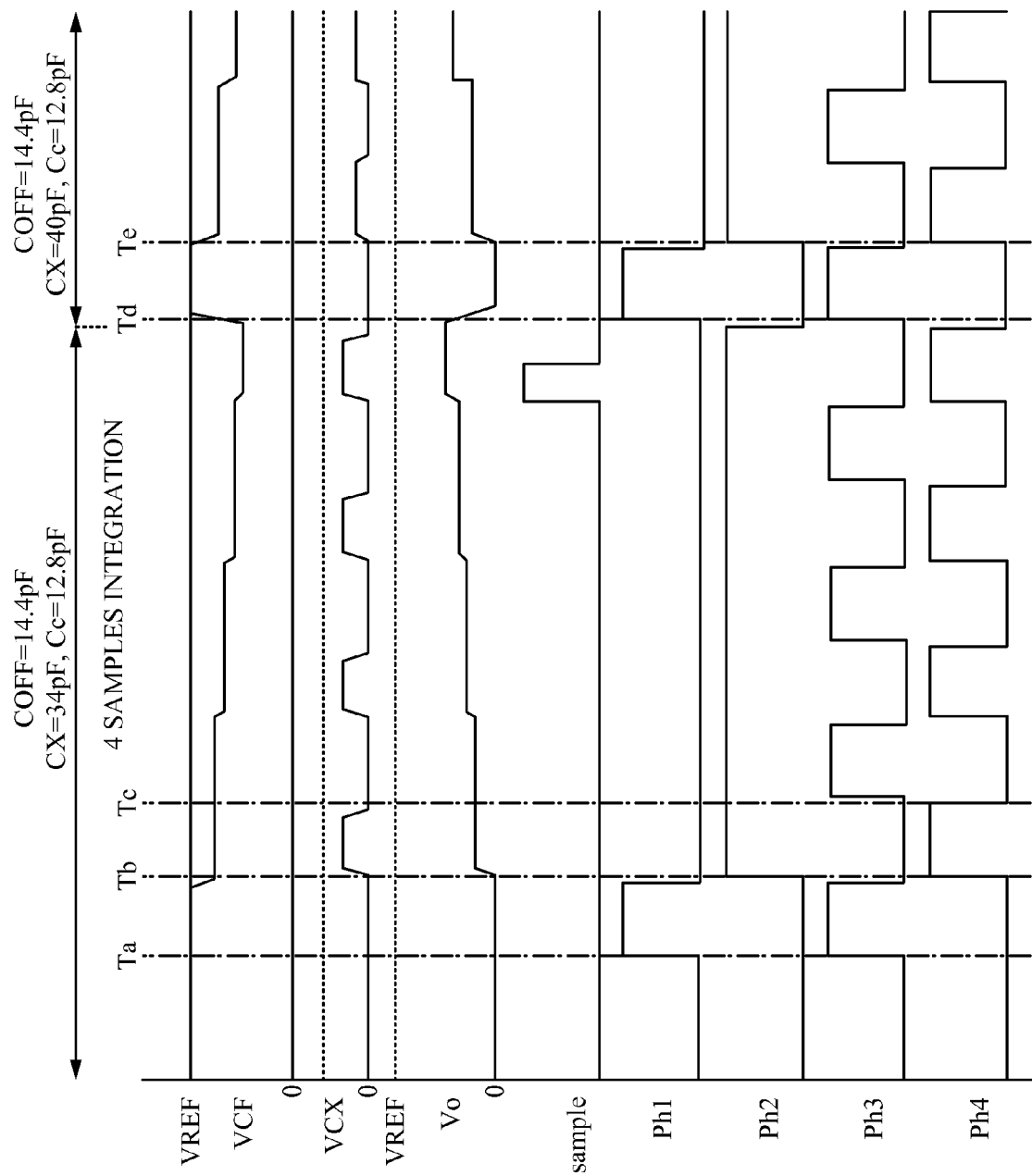
FIG. 9 shows voltage diagrams of the sensor component in FIGS. 8A-C during different phases of operation.

FIG. 9 is a timing diagram for the charge transfer circuit 500, for N=4. Referring to FIGS. 9 and 8A-C, Ta indicates the start of Phase 1, during which Ph1 goes HIGH. The circuit 500 enters the reset phase for the integrator. The output of the operational amplifier 420 is held at 0 V, the voltages across $C_X$ is zero, and $C_{XOFF}$ is charged to $V_{REF}$.

Tb indicates the start of phase 2, during which Ph2 goes HIGH. Ph1 goes low and there is a non-zero non-overlap time between Ph1 going LOW and Ph2 going HIGH. Ph2 remains HIGH throughout the N integration cycles. The operational amplifier 420 feedback switches are closed and the circuit 500 is connected to the sensor capacitance $C_X$ through series switches and Cc, the coupling capacitor. The output of the operational amplifier 420 goes to a value decided by the four capacitors $C_X$, $C_{OFF}$, Cc and $C_{INT}$, the voltage across $C_X$ is $V_X$, which is given by the equation above. The voltage across the feedback capacitor $C_{INT}$, which was initially charged to $V_{REF}$, starts to fall. The integrator output continues to accumulate and the voltage at $V_{OUT}$ continues to rise. The step change in the output voltage is given by the equations above. The sample from the integrator is taken after N integrator cycles.

Still referring to FIG. 9, Tc indicates the start of Phase 3 and the end of Phase 2. After a non-overlap time the next discharge phase for the coupling capacitor Cc starts. This is phase 3 as described above. During phase 3, the output of the integrator is held constant from Phase 2, while the coupling capacitor Cc, $C_{XOFF}$ and $C_X$ are all reset to their initial states. The voltage at the node $V_X$ is forced to $V_{REF}$.

This cycle of repeating phase 3 and phase 2 for the coupling capacitor Cc is performed a number of times and the final output of the integrator is sampled onto an analog-to-digital converter. This forms the single averaged voltage which represents the sensor capacitance present at the selected channel For the example of FIG. 9, $C_X$=34 pF, $C_{OFF}$=14.4 pF, Cc=12.8 pF, $C_{INT}$=19.2 pF and $V_{REF}$=1 V.

$$V_X = ((2*C_{OFF} + Cc)/(C_X + C_{OFF} + Cc))*V_{REF}$$

$$V_X = 0.680 \ V$$

$$V_O = (Cc/C_{INT})*(V_{REF} - V_X)$$

The step change in output voltage with integration is 0.213 V

As for times Td and Te, the Phases Ta and Tb are respectively repeated for the next channel. For clarity, the value of $C_X$ (sensor capacitance) is shown to be different to the two channels.

Figure 10:
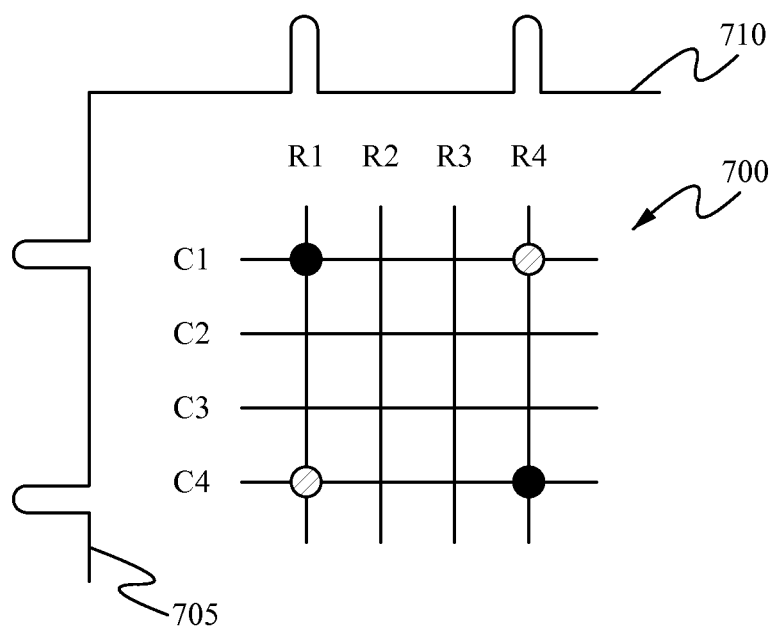
FIG. 10 shows real and ghost locations of multiple touches on a touchscreen, used to explain the principles of the invention.

FIG. 10 shows a touch panel 700 used to explain how ghosting is eliminated in accordance with principles of the invention. The touch panel 700 contains four overlapping row lines (R1-R4) and column lines (C1-C4). Those skilled in the art will recognize that the principles of the invention work with touch panels having any number of row and column lines, and, generally more than 4 of each. The touch panel 700 shows only four rows and columns merely to simplify the drawings.

Simultaneous "real" touches occur at the intersection of row R1 and column C1 ("R1C1") and at the intersection of row 4 and column 4 (R4C4), as indicated by the solid circles. The system, scanning all the row and column lines sequentially, senses touches as shown by the profiles 705 and 710, that is, on column C1 and C4 and rows R1 and R4. The profiles 705 and 710 indicate that touches could have occurred at any of the intersections of these row and column lines, that is, at the combinations R1C1, R1C4, R4C1, and R4C4. The combinations at which touches did not occur (R1C4 and R4C1) are called "ghost touches," as indicated by hatched circles. It will be appreciated that the larger the number of simultaneous real touches, the larger the number of ghost touches that must be processed and eliminated from consideration.

In accordance with the principles of the invention, the system sequentially scans the individual row and column lines (self capacitance) to determine a set of "candidate" touch locations (e.g., the set containing R1C1, R1C4, R4C1, and R4C4). Next, these combinations, and only these combinations, are sensed using mutual capacitance. Only the real touch locations will indicate the presence of an overlying object. In this way, embodiments of the invention require only searches on a linear order (e.g., number of rows+the number of columns, since the number of mutual capacitance touches that must be considered are of the same order) to disambiguate real touches from ghost touches.

In mutual capacitance mode, the steps are changed from those described above, to allow for cancellation of mutual capacitance.

Again referring to FIGS. 5A and 5B, in the Reset phase, $C_X$ is discharged, $C_{INT}$ is charged to $-V_{REF}$, and $C_{OFF}$ is charged to $V_{REF}$. $C_U$ for all the unselected lines are discharged, and $C_U$ for the selected line (e.g., $C_{U-R1C1}$) is charged to $-V_{REF}$. In the Measurement phase, $C_{INT}$ is coupled across the operational amplifier 420, and $C_X$ is connected to the negative terminal of the operational amplifier 420. Both ends of all the $C_X$ are connected to $V_{REF}$, so their charge does not change. $C_U$ for the selected line (through the switch S3) is charged to $V_{REF}$. The output of operational amplifier 420 for the selected line is given by Equation (8):

$$V_0 = \text{Constant} * V_{REF} * C_{U-R1C1}/C_{INT} + V_{REF} * (C_X - C_{OFF})/C_{INT} \quad \text{Equation (9)}$$

In this example, Constant equals 2 because flipping the polarity magnifies the effect of the mutual capacitance.

Comparing Equations (2) and (9), it is readily apparent that $V_0$ contains the self-capacitance measurement of Equation (2). As explained below, the difference between these two equations, indicating a mutual capacitance between lines, can be used to disambiguate ghost touches from real touches.

In one embodiment, the selected sensor (i.e., one row for column measurement and one column for a row measurement) is driven to $V_{REF}$ during the discharge phase and to ground during the integrate phase. Alternatively, the selected sensor can be held at ground all the time, in which case Constant has the value of 1.

The output can be converted to a digital code by an ADC. When the digital output from the normal measurement (e.g., given by Equation (2) above) is subtracted from the mutual capacitance measurement (Equation (9)), the mutual capacitance between a row and column can be deduced. This result is used to resolve the ambiguity in the position when multiple simultaneous touches are present.

Figure 11:
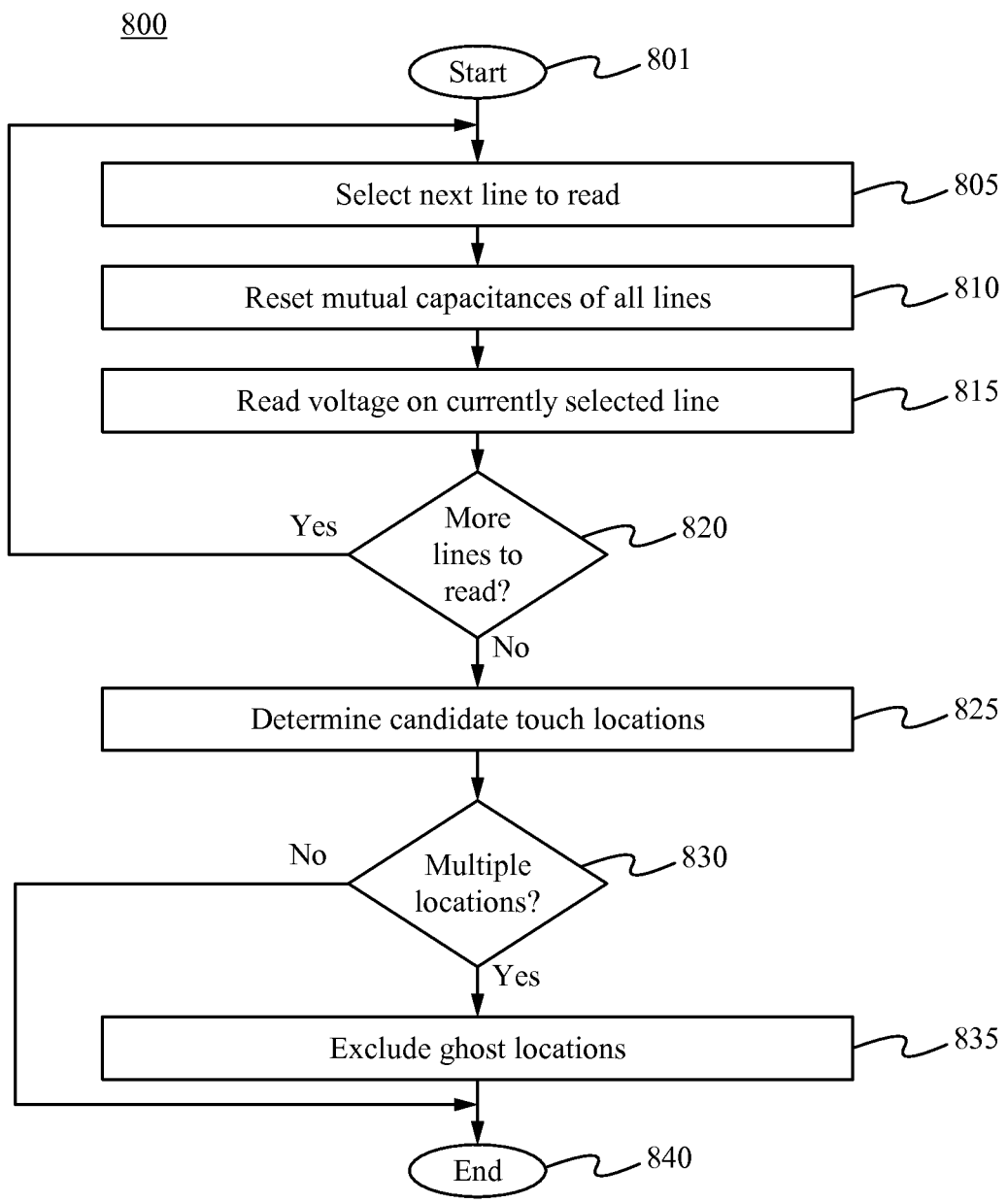
FIG. 11 shows the steps of a method of measuring the voltages on sensing elements using both self capacitance and mutual capacitance to eliminate ghosting in accordance with the present invention.

FIG. 11 is a flow chart of the steps of a process of determining the location of an object adjacent to a touch sensor in accordance with one embodiment of the invention, utilizing both self capacitance and mutual capacitance. After the start step 801, in the step 805 the process selects the next line (e.g., R1) to read. In the step 805, the reset phase, the process resets the mutual capacitances of all the lines (e.g., the capacitive sensing elements connected to each of R1-R4 and C1-C4), and in the step 815 the process charges the sensor on the currently selected line and reads the voltage on it. A voltage above a predetermined threshold value indicates the presence of an object on the selected line. In the step 820, the process determines whether there are additional lines to read. If so, the process loops back to the step 805. Otherwise, the process continues to the step 825. The steps 805, 810, and 815 are part of a self-capacitance measuring stage, in which all the lines are individually read.

In the step 825, the process determines whether there have been multiple locations at which a touch has been sensed. If the process determines that objects are simultaneously present at multiple locations, the process must consider and exclude any ghost touches. If there is only one touch, ghost touches do not have to be considered. Thus, if in the step 830 the process determines that it must identify and exclude ghost locations, the process continues to the step 835. Otherwise, the process jumps to the step 840, where it ends. In the step 835, the process excludes any ghost locations and then continues to the step 840.

Figure 12:
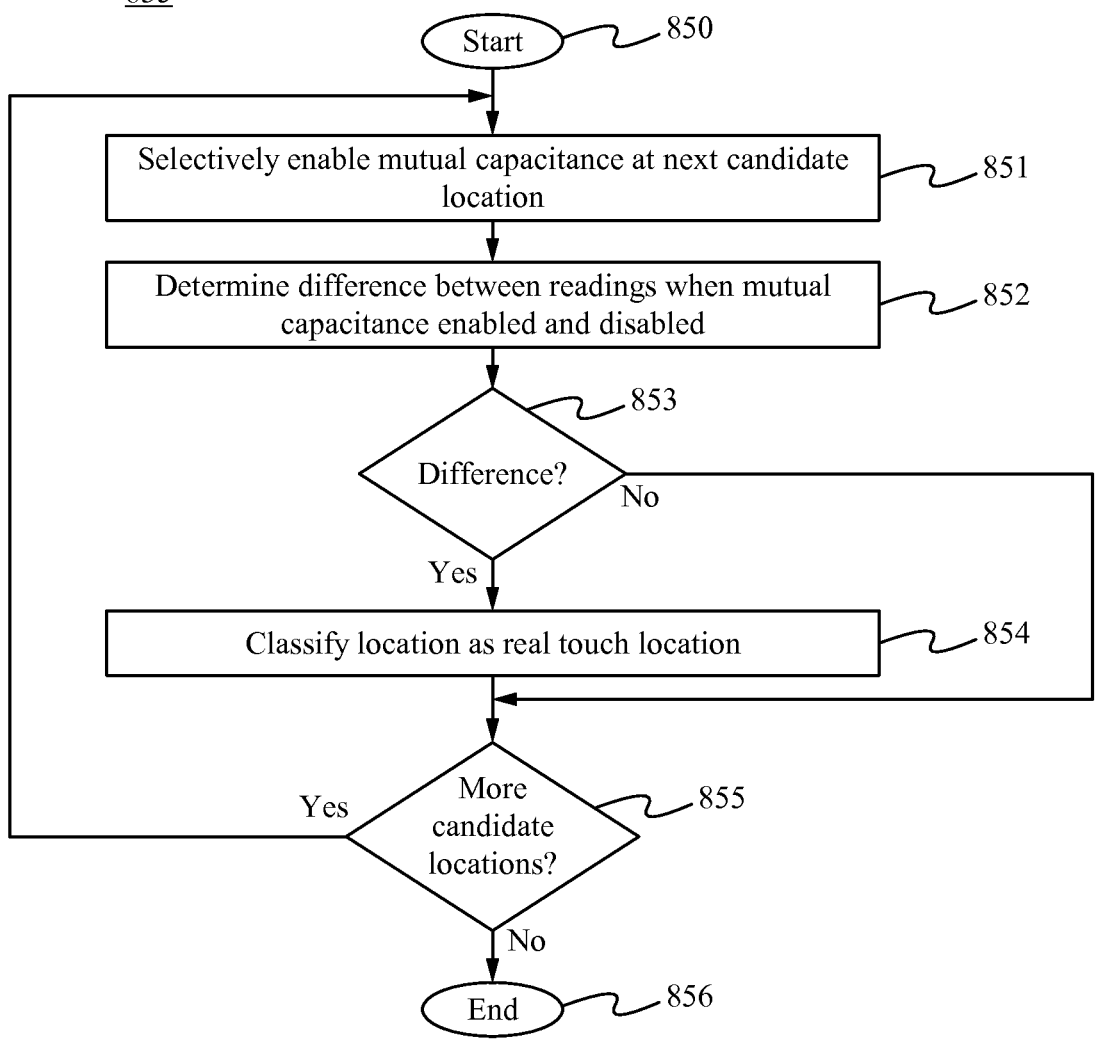
FIG. 12 shows the steps of a method of selectively enabling mutual capacitance in combination with self capacitance, as illustrated in FIG. 11.

FIG. 12 shows more detailed components of the step 835 in accordance with one embodiment of the invention. The component 835 starts in the step 850, where parameters are initialized, such as by setting the "next" candidate location to the first candidate location. Next, in the step 851, the process selectively enables the mutual capacitance at the next candidate location (e.g., Equation (9) above) and, in the step 852, determines the difference between this reading and the corresponding reading when the mutual capacitance is disabled. In the step 853, the process determines whether there is any difference and, if there is, proceeds to the step 854, in which the location is classified as a "real" touch location. From step 854, the process continues to the step 855. If, in the step 853, the process determines that there is no difference between the two readings, the process identifies the location as a "ghost" location, excluding it as a real touch location, and proceeds to the step 855. In the step 855, the process determines whether there are any more candidate locations to check. If there are, the process loops back to the step 851. Otherwise, the process proceeds to the step 856, where it ends.

After the actual touch locations have been determined, they can be transmitted to any downstream application programs that uses them as input.

In accordance with the invention, a touchscreen controller uses a single integrated circuit to perform both self-capacitance and mutual capacitance measurements to resolve multiple simultaneous touches in a linear number of measurements. The controller cancels mutual capacitances during the self-capacitance stage and selectively enables mutual capacitance during the mutual capacitance stage. In both stages, the controller converts sensor capacitance in the touchscreen to a directly proportional voltage. Touchscreens in accordance with the invention null the effect of mutual capacitance and therefore have increased dynamic range.

It will be readily apparent to one skilled in the art that other modifications may be made to the embodiments without departing from the spirit and scope of the invention as defined by the appended claims.

We claim:

1. A touchscreen controller system for sensing one or more objects adjacent to a surface of a touch panel comprising:
   a plurality of sense lines arranged adjacent to the surface of the touch panel, wherein adjacent sense lines have a mutual capacitance;
   a plurality of capacitive sensing elements each coupled to one of the sense lines;
   a voltage measurement circuit that converts a charge on a selected capacitive sensing element into a corresponding voltage that indicates whether an object is adjacent to the surface of the touch panel; and
   control logic configured to selected sense lines for reading and to drive mutual capacitances between selected and unselected sense lines to the same potential during a self-capacitance measuring stage and to drive mutual capacitances between selected and unselected sense lines to different potentials during a mutual capacitance measuring stage,
   wherein the voltage measurement circuit comprises an operational amplifier having a feedback loop that includes an integrating capacitor, the operational amplifier and the integrating capacitor formed on a single integrated circuit, and wherein the voltage measurement circuit comprises an offset cancellation capacitor in parallel with the integrating capacitor, the offset cancellation capacitor configured to provide a minimum feedback factor for the operational amplifier to alleviate a variation in a feedback factor caused by a variation in an external parasitic capacitor.

2. The touchscreen controller system of claim 1, wherein the sense lines are arranged as row and column lines that form a grid pattern.

3. The touchscreen controller system of claim 1, wherein the self-capacitance measuring stage comprises individually reading a capacitance on each of the capacitive sensing elements to determine whether an object is adjacent thereto.

4. The touchscreen controller system of claim 1, wherein the mutual capacitance measuring stage comprises reading a capacitance on combinations of capacitance sensing elements to determine whether an object is adjacent thereto.

5. The touchscreen controller system of claim 1, wherein the voltage measurement circuit generates a voltage differential proportional to a capacitance of the object and the integrating capacitor.

6. A touchscreen controller system for sensing one or more objects adjacent to a surface of a touch panel comprising:
- a plurality of sense lines arranged adjacent to the surface of the touch panel, wherein adjacent sense lines have a mutual capacitance;
- a plurality of capacitive sensing elements each coupled to one of the sense lines;
- a voltage measurement circuit that converts a charge on a selected capacitive sensing element into a corresponding voltage that indicates whether an object is adjacent to the surface of the touch panel; and
- control logic configured to selected sense lines for reading and to drive mutual capacitances between selected and unselected sense lines to the same potential during a self-capacitance measuring stage and to drive mutual capacitances between selected and unselected sense lines to different potentials during a mutual capacitance measuring stage, wherein the voltage measurement circuit generates a voltage differential proportional to a capacitance of the object and the integrating capacitor.

7. The touchscreen controller system of claim 6, wherein the sense lines are arranged as row and column lines that form a grid pattern.

8. The touchscreen controller system of claim 6, wherein the self-capacitance measuring stage comprises individually reading a capacitance on each of the capacitive sensing elements to determine whether an object is adjacent thereto.

9. The touchscreen controller system of claim 6, wherein the mutual capacitance measuring stage comprises reading a capacitance on combinations of capacitance sensing elements to determine whether an object is adjacent thereto.

10. The touchscreen controller system of claim 6, wherein the voltage measurement circuit comprises an operational amplifier having a feedback loop that includes an integrating capacitor, wherein the operational amplifier and the integrating capacitor are formed on a single integrated circuit.

11. The touchscreen controller system of claim 10, wherein the voltage measurement circuit comprises an offset cancellation capacitor in parallel with the integrating capacitor.

12. The touchscreen controller system of claim 11, wherein the offset cancellation capacitor is configured to provide a minimum feedback factor for the operational amplifier to alleviate a variation in a feedback factor caused by a variation in an external parasitic capacitor.

\* \* \* \* \*

UNITED STATES PATENT AND TRADEMARK OFFICE
CERTIFICATE OF CORRECTION

PATENT NO. : 8,624,870 B2  
APPLICATION NO. : 12/986841  
DATED : January 7, 2014  
INVENTOR(S) : Ashutosh Ravindra Joharapurkar et al.

It is certified that error appears in the above-identified patent and that said Letters Patent is hereby corrected as shown below:

On the title page, item 75 Inventors section, change "Venugopal Reddy" to --Raja Venugopal Reddy--.

Signed and Sealed this
Sixteenth Day of February, 2016

Michelle K. Lee
*Director of the United States Patent and Trademark Office*